(12) United States Patent
DaSilva et al.

(10) Patent No.: US 11,050,496 B2
(45) Date of Patent: Jun. 29, 2021

(54) OVER-THE-AIR TESTING OF MILLIMETER WAVE INTEGRATED CIRCUITS WITH INTEGRATED ANTENNAS

(71) Applicant: NATIONAL INSTRUMENTS CORPORATION, Austin, TX (US)

(72) Inventors: Marcus K. DaSilva, Oak Grove, OR (US); Chen Chang, Fremont, CA (US); Charles G. Schroeder, Cedar Park, TX (US); Ahsan Aziz, Austin, TX (US); Paramjit S. Banwait, Fremont, CA (US)

(73) Assignee: National Instruments Corporation, Austin, TX (US)

( * ) Notice: Subject to any disclaimer, the term of this patent is extended or adjusted under 35 U.S.C. 154(b) by 154 days.

(21) Appl. No.: 16/168,650

(22) Filed: Oct. 23, 2018

(65) Prior Publication Data

US 2019/0353698 A1 Nov. 21, 2019

Related U.S. Application Data

(60) Provisional application No. 62/674,455, filed on May 21, 2018.

(51) Int. Cl.
*H04B 17/27* (2015.01)
*H04B 17/17* (2015.01)
(Continued)

(52) U.S. Cl.
CPC ............. *H04B 17/17* (2015.01); *G01R 1/045* (2013.01); *G01R 31/2856* (2013.01);
(Continued)

(58) Field of Classification Search
CPC ...... H04B 17/17; H04B 17/27; H04B 17/336; H04B 17/12; H04B 17/29;
(Continued)

(56) References Cited

U.S. PATENT DOCUMENTS

| 4,980,636 A | 12/1990 | Romanofsky et al. |
| 6,191,744 B1 | 2/2001 | Snow et al. |

(Continued)

FOREIGN PATENT DOCUMENTS

| CN | 107748298 A | 3/2018 |
| EP | 3264641 A1 | 1/2018 |

OTHER PUBLICATIONS

International Search Report and Written Opinion in International Application No. PCT/US2019/032233, dated Aug. 20, 2019, 15 pages.

(Continued)

*Primary Examiner* — Dominic E Hawkins
(74) *Attorney, Agent, or Firm* — Kowert, Hood, Munyon, Rankin & Goetzel, P.C.; Jeffrey C. Hood

(57) ABSTRACT

Testing devices such as integrated circuits (IC) with integrated antennas configured for millimeter wave (mmW) transmission and/or reception. A DUT may be mounted to an interface in a measurement fixture (e.g., a socket, anechoic chamber, etc.). Power and data connections of the DUT may be tested over the interface, which may also provide connections (e.g., wired) for input/output signals, power, and control and may also provide positioning. Radio frequency (RF) characteristics of the DUT may be tested over-the-air using an array of antennas or probes in the radiating Fresnel zone of the DUT's antennas. Each of the antennas or probes of the array may incorporate a power detector (e.g., a diode) so that the RF radiating pattern may be measured using DC voltage measurements. Measured voltage measurements may be compared to an ideal signature, e.g., voltage measurements expected from an ideal or model DUT.

20 Claims, 17 Drawing Sheets configured with program instructions according to embodiments of the invention

82
Computer System

(51) Int. Cl.
  *H04B 17/336* (2015.01)
  *H01Q 3/26* (2006.01)
  *G01R 1/04* (2006.01)
  *G01R 31/28* (2006.01)
  *G01R 31/319* (2006.01)
  *H04B 17/12* (2015.01)

(52) U.S. Cl.
  CPC ... *G01R 31/2884* (2013.01); *G01R 31/31905* (2013.01); *H01Q 3/267* (2013.01); *H04B 17/27* (2015.01); *H04B 17/336* (2015.01); *H04B 17/12* (2015.01)

(58) Field of Classification Search
  CPC .......... G01R 31/31905; G01R 31/2856; G01R 31/2884; G01R 31/3025; G01R 31/2822
  See application file for complete search history.

(56) References Cited

U.S. PATENT DOCUMENTS

| | | | |
|---|---|---|---|
| 6,525,657 B1 | 2/2003 | Wojcik | |
| 8,212,572 B2 | 7/2012 | Webb | |
| 8,374,552 B2 | 2/2013 | Rupp et al. | |
| 8,706,044 B2 | 4/2014 | Chang et al. | |
| 8,868,021 B1 | 10/2014 | Feldman | |
| 8,995,513 B1 | 3/2015 | Sandoval et al. | |
| 9,065,609 B2 | 6/2015 | McCoy | |
| 9,419,784 B2 | 8/2016 | Bossche | |
| 9,459,295 B2 | 10/2016 | Wertz | |
| 9,477,566 B2 | 10/2016 | Baker | |
| 9,483,372 B2 | 11/2016 | Baker | |
| 9,581,630 B2 | 2/2017 | Verbeyst et al. | |
| 9,871,649 B2 | 1/2018 | Chopra et al. | |
| 9,917,755 B1 | 3/2018 | Rullmann et al. | |
| 10,085,162 B2 | 9/2018 | Foegelle | |
| 2002/0127971 A1 | 9/2002 | Chen et al. | |
| 2005/0283697 A1* | 12/2005 | Kang | G01R 31/31932 714/742 |
| 2009/0153158 A1* | 6/2009 | Dunn | G01R 31/2822 324/762.01 |
| 2012/0212244 A1 | 8/2012 | Zhao et al. | |
| 2012/0293379 A1 | 11/2012 | Nickel et al. | |
| 2013/0178203 A1 | 7/2013 | Venkataraman | |
| 2014/0161164 A1* | 6/2014 | Emmanuel | H04B 5/0043 375/224 |
| 2014/0273873 A1* | 9/2014 | Huynh | H04B 17/29 455/67.12 |
| 2014/0370821 A1 | 12/2014 | Guterman et al. | |
| 2015/0177277 A1 | 6/2015 | Nickel et al. | |
| 2017/0141619 A1* | 5/2017 | Linnartz | H02J 50/001 |
| 2017/0356947 A1* | 12/2017 | Kurimoto | G01R 35/00 |
| 2018/0034566 A1* | 2/2018 | Tankielun | H01Q 3/267 |
| 2018/0267096 A1 | 9/2018 | Lindell et al. | |
| 2019/0113566 A1 | 4/2019 | Kao | |

OTHER PUBLICATIONS

Valdes et al., U.S. Appl. No. 16/141,697, entitled "Hardware Timed Over-the-Air Antenna Characterization", filed Sep. 25, 2018, 72 pages.

Valdes et al., U.S. Appl. No. 16/141,733, entitled "Correlation of Device-Under-Test Orientations and Radio Frequency Measurements", filed Sep. 25, 2018, 75 pages.

Valdes et al., U.S. Appl. No. 16/141,733, entitled "Correlation of Device-Under-Test Orientations and Radio Frequency Measurements", filed Sep. 25, 2018, 74 pages.

* cited by examiner

OVER-THE-AIR TESTING OF MILLIMETER WAVE INTEGRATED CIRCUITS WITH INTEGRATED ANTENNAS

PRIORITY CLAIM

This application claims priority to U.S. provisional patent application Ser. No. 62/674,455, entitled "Over-the-Air Testing of Millimeter Wave Integrated Circuits with Integrated Antennas," filed May 21, 2018, which is hereby incorporated by reference in its entirety as though fully and completely set forth herein.

FIELD OF THE INVENTION

The present invention relates to the field of semiconductor testing, and more specifically, to testing of millimeter wave integrated circuits with integrated antennas.

DESCRIPTION OF THE RELATED ART

Millimeter wave (mmW) technology is rapidly growing in importance, e.g., as $5^{th}$ generation (5G) wireless technology is becoming more widespread. Current methods for testing integrated circuits with integrated antennas for transmitting and/or receiving mmW signals may be slow and/or expensive, e.g., in part because the integrated circuits may not support wired connections for mmW inputs and outputs. Improvements in the field are desired.

SUMMARY OF THE INVENTION

Various embodiments are presented below of a system and method for testing (e.g., rapidly and cheaply) devices such as integrated circuits (IC) with integrated antennas configured for millimeter wave (mmW) transmission and/or reception. A device to be tested (e.g., the device under test (DUT)) may be mounted to an interface providing wired connections for input and output signals, power, control, and positioning in a measurement fixture. Power and data connections of the DUT may be tested over the interface. Radio frequency (RF) characteristics (e.g., including transmission, reception, and/or beamforming) of the DUT may be tested over-the-air using an array of antennas or probes in the radiating Fresnel zone of the DUT's antennas, e.g., within the measurement fixture. Each of the antennas or probes of the array may incorporate a power detector (e.g., a diode) so that the RF radiating pattern may be measured using direct current (DC) voltage measurements. Measured voltage measurements may be compared to an ideal signature, e.g., voltage measurements expected from an ideal or model DUT.

BRIEF DESCRIPTION OF THE DRAWINGS

A better understanding of the present invention can be obtained when the following detailed description of the preferred embodiment is considered in conjunction with the following drawings, in which.

Figure 1:
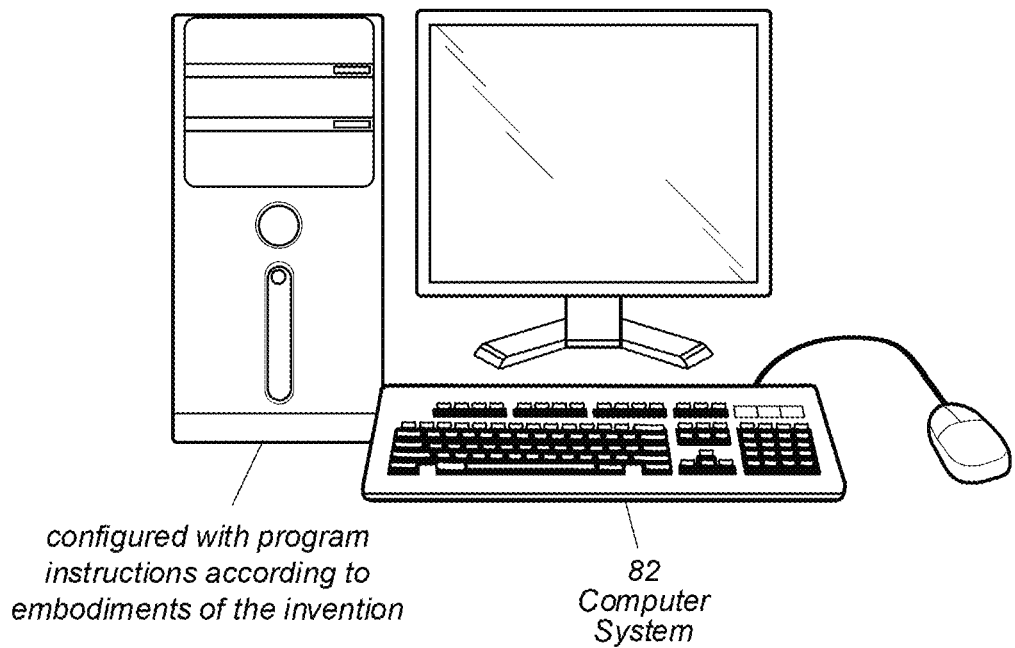
FIG. 1 illustrates a computer system configured to perform testing of an integrated circuit, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Terms

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPGAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic."

Processing Element—refers to various elements or combinations of elements that are capable of performing a function in a device, such as a user equipment or a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually," wherein the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism," where the tasks are performed in an interleaved manner, e.g., by time multiplexing of execution threads.

Wireless—refers to a communications, monitoring, or control system in which electromagnetic or acoustic waves carry a signal through space rather than along a wire.

Approximately—refers to a value being within some specified tolerance or acceptable margin of error or uncertainty of a target value, where the specific tolerance or margin is generally dependent on the application. Thus, for example, in various applications or embodiments, the term approximately may mean: within 0.1% of the target value, within 0.2% of the target value, within 0.5% of the target value, within 1%, 2%, 5%, or 10% of the target value, and so forth, as required by the particular application of the present techniques.

FIG. 1A—Computer System

FIG. 1A illustrates a computer system 82 configured to implement embodiments of the techniques disclosed herein. Embodiments of a method for (e.g., for production testing of integrated circuits) are described below. Note that various embodiments of the techniques disclosed herein may be implemented in a variety of different ways. For example, in some embodiments, some or all of the techniques may be implemented with textual or graphical programs that may be deployed to, or used to configure, any of various hardware devices.

However, while some embodiments are described in terms of one or more programs, e.g., graphical programs, executing on a computer, e.g., computer system 82, these embodiments are exemplary only, and are not intended to limit the techniques to any particular implementation or platform. Thus, for example, in some embodiments, the techniques may be implemented on or by a functional unit (also referred to herein as a processing element), which may include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

As shown in FIG. 1, the computer system 82 may include a display device configured to display a graphical program as the graphical program is created and/or executed. The display device may also be configured to display a graphical user interface or front panel of the graphical program during execution of the graphical program. The graphical user interface may comprise any type of graphical user interface, e.g., depending on the computing platform.

The computer system 82 may include at least one memory medium on which one or more computer programs or software components according to one embodiment of the present invention may be stored. For example, the memory medium may store one or more programs, such as graphical programs, that are executable to perform the methods described herein. The memory medium may also store operating system software, as well as other software for operation of the computer system. Various embodiments further include receiving or storing instructions and/or data implemented in accordance with the foregoing description upon a carrier medium.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications include hardware-in-the-loop testing and rapid control prototyping, among others.

However, it is noted that embodiments of the present invention can be used for a plethora of applications and is not limited to the above applications. In other words, applications discussed in the present description are exemplary only, and embodiments of the present invention may be used in any of various types of systems. Thus, embodiments of the system and method of the present invention is configured to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 2A:
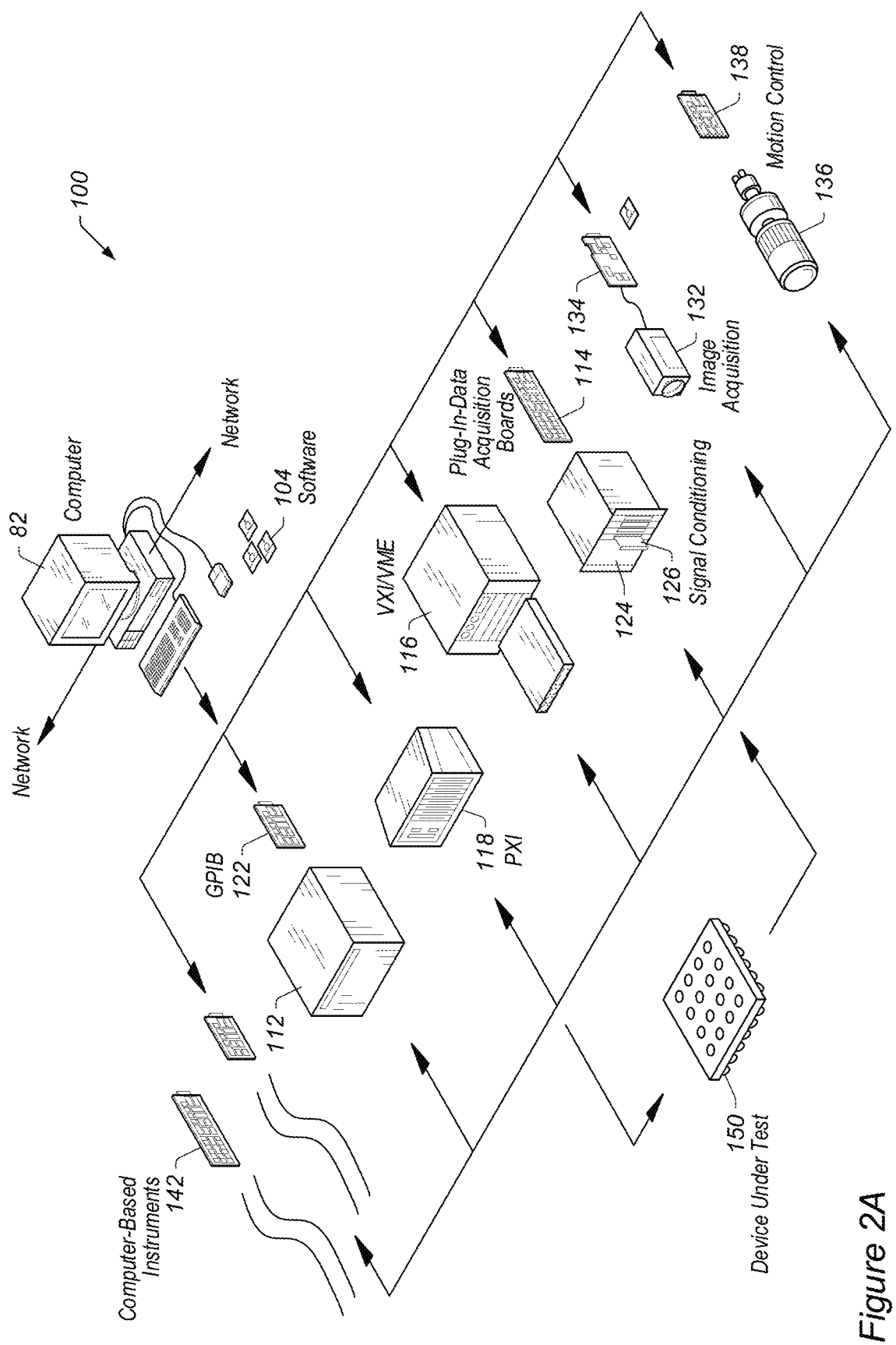
FIG. 2A illustrates an instrumentation control system according to some embodiments.

FIG. 2A illustrates an exemplary instrumentation control system 100 which may implement embodiments described herein. The system 100 comprises a host computer 82 which couples to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150, e.g., via execution of software 104.

The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to the device under test (DUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

Figure 2B:
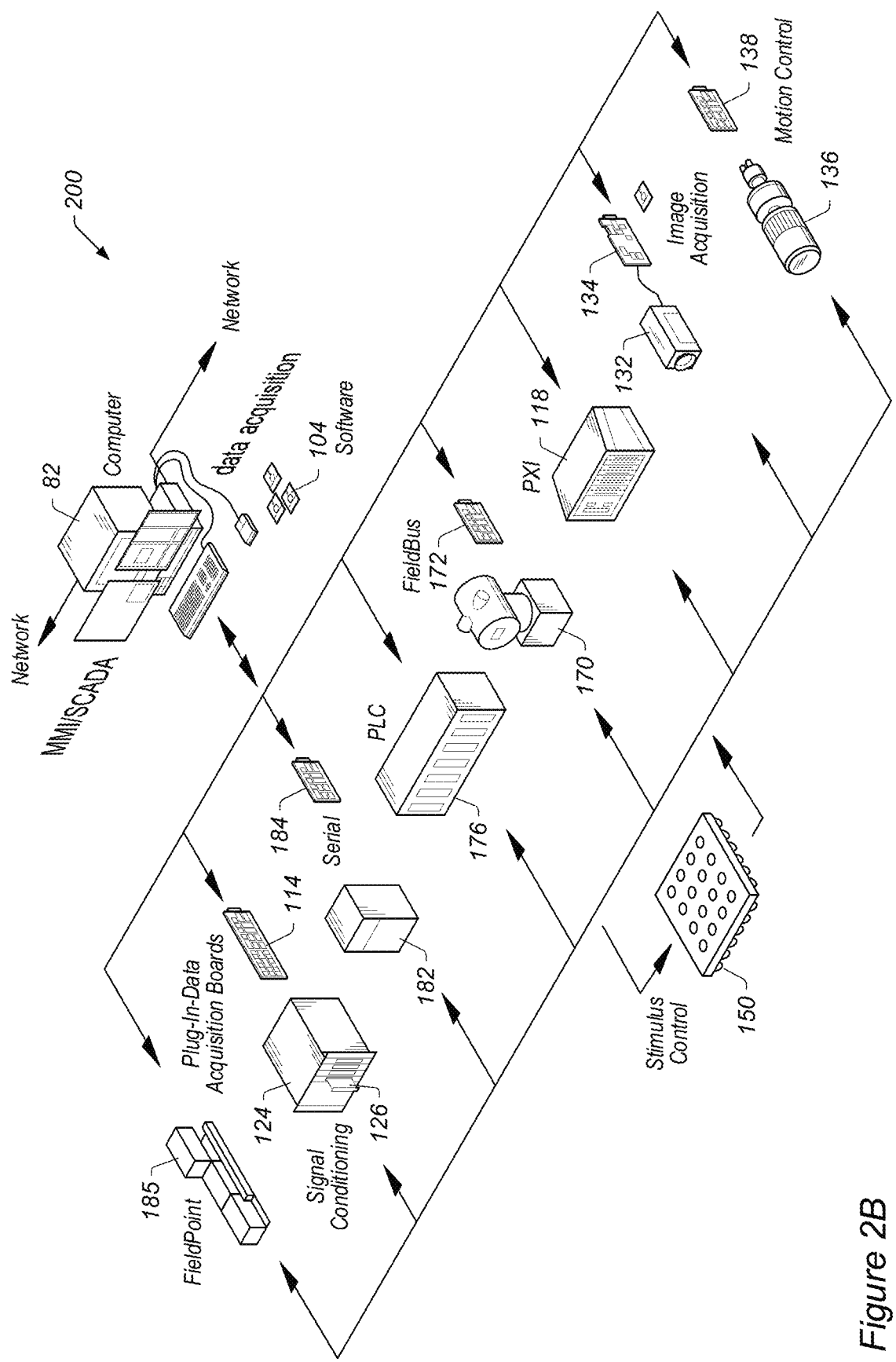
FIG. 2B illustrates an industrial automation system according to some embodiments.

FIG. 2B illustrates an exemplary industrial automation system 200 which may implement embodiments described herein. The industrial automation system 200 is similar to the instrumentation or test and measurement system 100 shown in FIG. 2A. Elements which are similar or identical to elements in FIG. 2A have the same reference numerals for convenience. The system 200 may comprise a computer 82 which couples to one or more devices or instruments. The computer 82 may comprise a CPU, a display screen, memory, and one or more input devices such as a mouse or keyboard as shown. The computer 82 may operate with the one or more devices to perform an automation function with respect to a process or device 150, such as HMI (Human Machine Interface), SCADA (Supervisory Control and Data Acquisition), portable or distributed data acquisition, process control, advanced analysis, or other control, among others, e.g., via execution of software 104.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a fieldbus device 270 and associated fieldbus interface card 172, a PLC (Programmable Logic Controller) 176, a serial instrument 282 and associated serial interface card 184, or a distributed data acquisition system, such as Fieldpoint system 185, available from National Instruments Corporation, among other types of devices.

In the embodiments of FIGS. 2A and 2B, above, one or more of the various devices may couple to each other over a network, such as the Internet. In one embodiment, the user operates to select a target device from a plurality of possible target devices for programming or configuration. Thus the user may create a program on a computer and use (execute)

the program on that computer or deploy the program to a target device (for remote execution on the target device) that is remotely located from the computer and coupled to the computer through a network.

Software programs that perform data acquisition, analysis and/or presentation, e.g., for measurement, instrumentation control, industrial automation, modeling, or simulation, such as in the applications shown in FIGS. 2A and 2B, may be referred to as virtual instruments.

Figure 3:
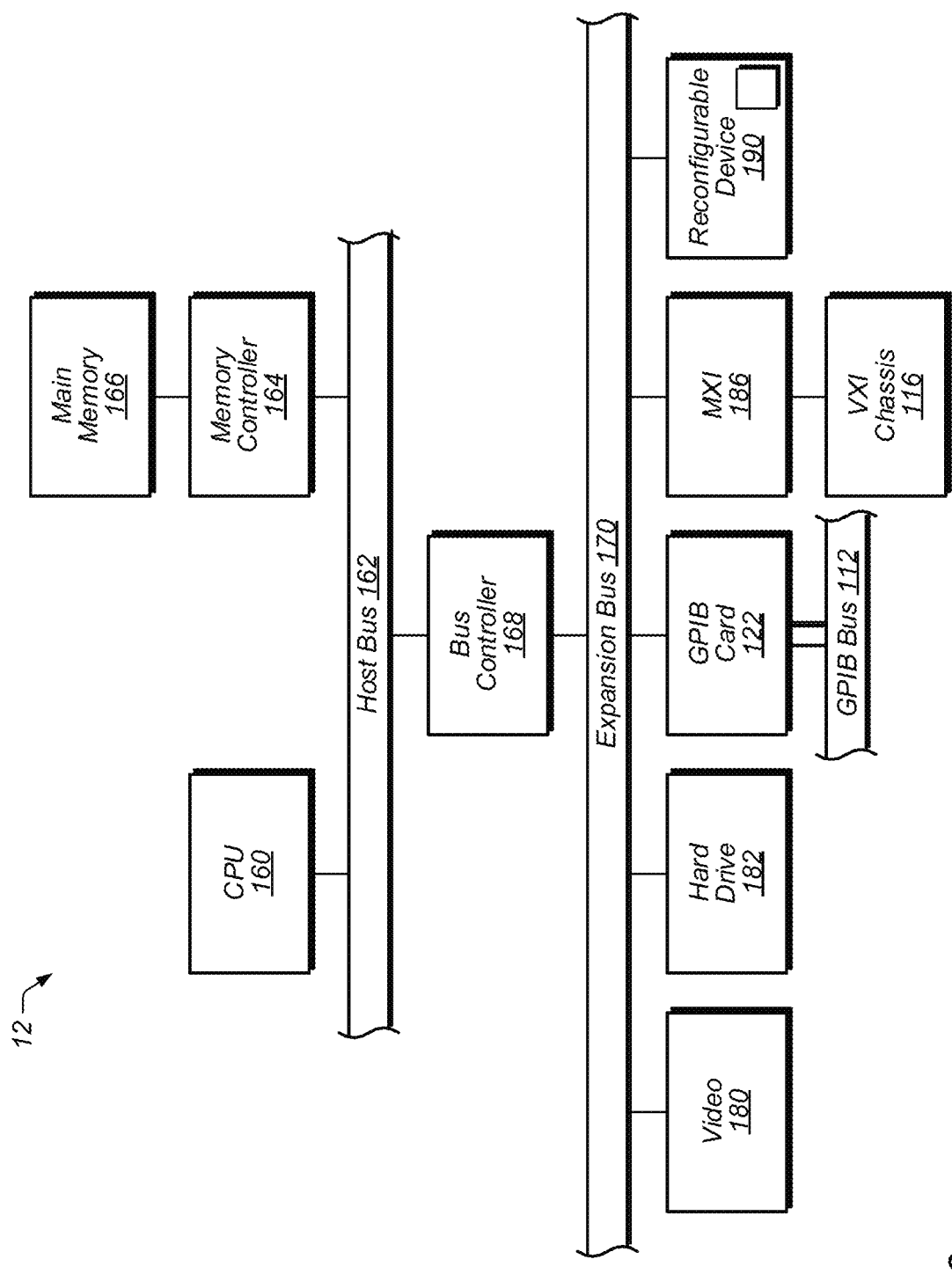
FIG. 3 is an exemplary block diagram of the computer systems of FIGS. 1, 2A, and 2B, according to some embodiments.

FIG. 3—Computer System Block Diagram

Figure 4:
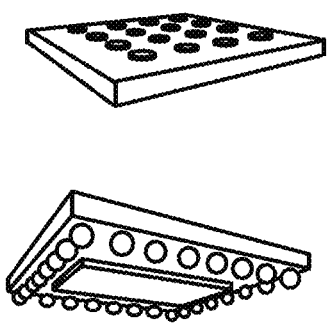
FIGS. 4-9 illustrate exemplary integrated circuits, according to some embodiments.

FIG. 3 is a block diagram 12 representing one embodiment of the computer system 82 illustrated in FIG. 1, 2A or 2B. It is noted that any type of computer system configuration or architecture can be used as desired, and FIG. 4 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including any type of processor (or multiple processors), as well as other features. A memory medium, typically comprising RAM and referred to as main memory, 166 is coupled to the host bus 162 by means of memory controller 164. The main memory 166 may store a program (e.g., a graphical program) configured to implement embodiments of the present techniques. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170. The computer 82 may also comprise a GPIB card 122 coupled to a GPIB bus 112, and/or an MXI device 186 coupled to a VXI chassis 116.

As shown, a device 190 may also be connected to the computer. The device 190 may include a processor and memory which may execute a real time operating system. The device 190 may also or instead comprise a programmable hardware element. The computer system may be configured to deploy a program to the device 190 for execution of the program on the device 190. The deployed program may take the form of graphical program instructions or data structures that directly represents the graphical program. Alternatively, the deployed program may take the form of text code (e.g., C code) generated from the program. As another example, the deployed program may take the form of compiled code generated from either the program or from text code that in turn was generated from the program.

FIGS. 4-9—Integrated Circuit (IC) with Antennas

Integrated circuits (IC) with integrated antennas are increasingly common. Such ICs are included in many devices and may be configured to perform various functions including wireless communication (e.g., including transmission and/or reception) and radar. In particular, 5G wireless communication standards (or other standards) may provide for the use of millimeter wave (mmW) band wireless signals and beamforming (e.g., directional transmission/reception). ICs or application specific ICs (ASICs) may be an important element of many wireless devices configured to communicate using such standards. For example, an IC with an integrated array of antennas (e.g., a phased array) may be a common means of including such 5G wireless capabilities. Further, some ICs may include multiple arrays of antennas.

FIG. 4 illustrates a phased array of antennas which may be incorporated into an IC such as a complementary metal-oxide-semiconductor (CMOS) Monolithic Microwave Integrated Circuit (MMIC). As illustrated the IC may be approximately 1 cm by 1 cm, among various possibilities.

Figure 5:
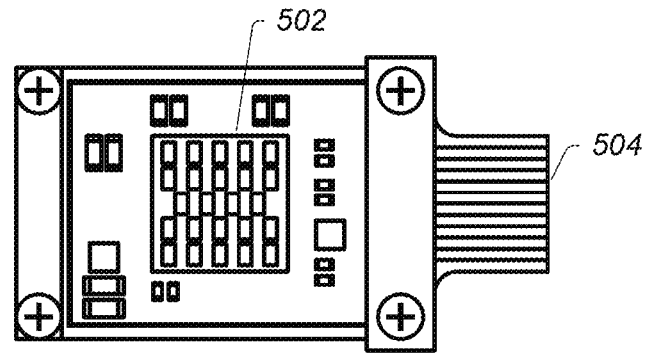

FIG. 5 illustrates an exemplary IC, including an integrated antenna array (502). Such an IC may be approximately 2.5 cm wide, among various possibilities. The IC may include a wired connection (504) for data and power.

Figure 6:
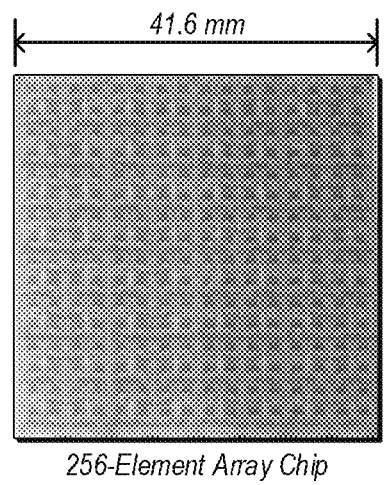

FIG. 6 illustrates an exemplary array of 256 antennas on a chip. The array may be approximately 4 cm wide, among various possibilities. It should be noted that other numbers or configurations of antennas are possible, as well as other sizes of chips.

Figure 7:
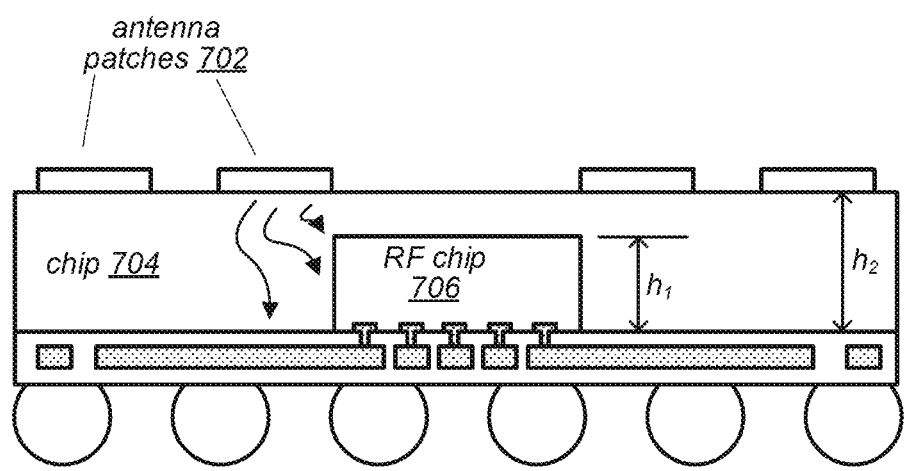

FIG. 7 illustrates an exemplary IC. As shown, the IC includes multiple (e.g., any desired number) antenna patches (702) mounted to a chip (704) (e.g., a printed circuit board (PCB), glass wafer, silicon wafer, etc.). The antenna patches may transmit signals to and from an integrated RF chip (or chips) (706). Note that the RF chip (706) may be included in the chip (704), but may not reach the full thickness of the chip (704). In the illustrated example, the RF chip (706) reaches height h1, which is less than the full height of the chip (704), h2. The RF chip (706) may be connected to other elements of the IC, e.g., via wired connections.

Figure 8:
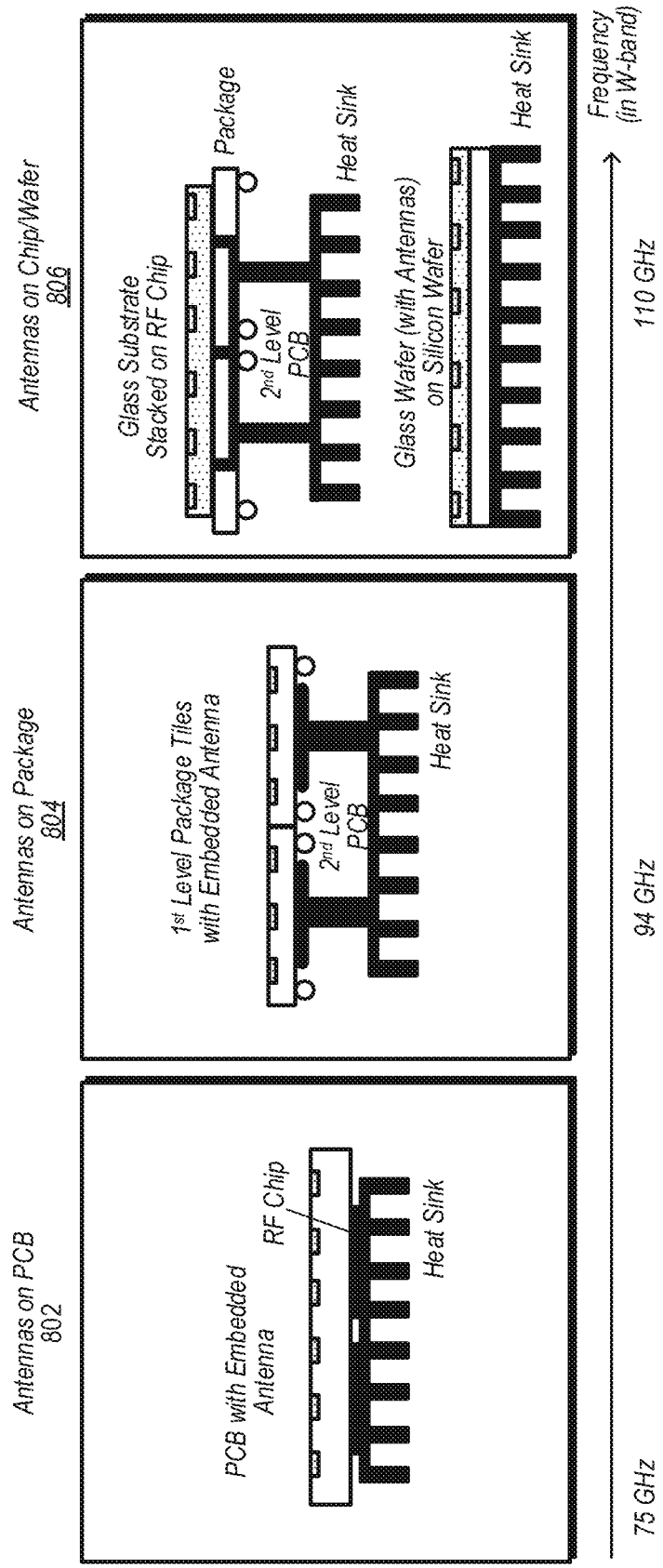

FIG. 8 illustrates different types of antenna connections of exemplary ICs. In a first configuration (802), antennas may be embedded in a printed circuit board (PCB), to which RF chips and a heat sink are mounted. Such a configuration may be useful for relatively low frequencies, e.g., approximately 75 GHz, according to some embodiments. In a second configuration (804), antenna patches may be embedded in package tiles, which are in turn mounted to RF chips and a (e.g., $2^{nd}$ level) PCB. The RF chips may be connected (thru the PCB) to a heat sink. Such a configuration may be useful for medium frequencies, e.g. 94 GHz, among various possibilities. A third configuration (806) may include antenna patches embedded in a glass substrate and stacked on RF chips, e.g., above a package, $2^{nd}$ level PCB, and heat sink. In a variation, the glass wafer may be mounted on a silicon wafer instead of a package. Such configurations may be useful for higher frequencies, e.g., 110 GHz and above, among various possibilities.

Figure 9:
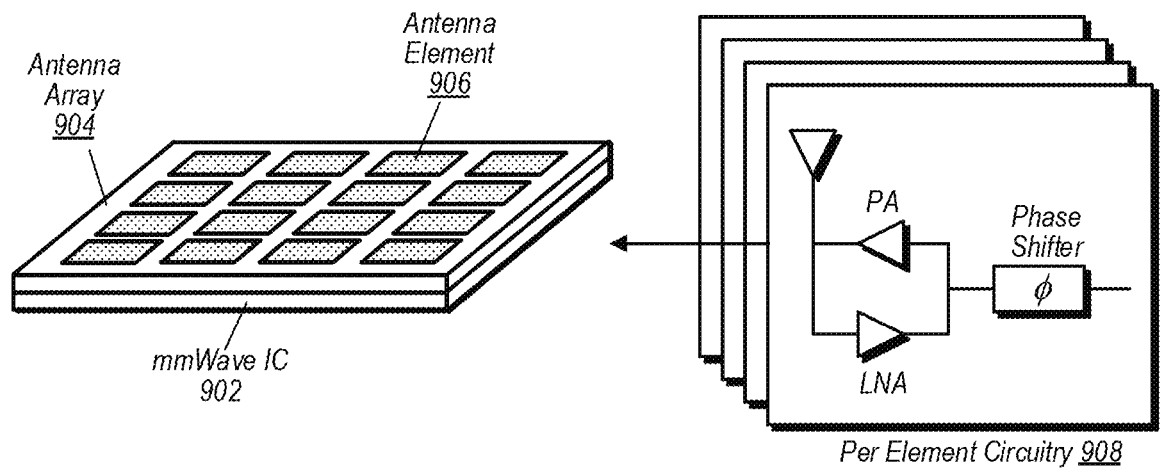

FIG. 9 illustrates an exemplary mmW IC (902) with an integrated antenna array (904). As shown, each antenna element (e.g., patch) (906) may have dedicated (e.g., per element) circuitry (908). Note that the specific antenna element circuitry shown is exemplary only, and that other circuit configurations may be used.

FIGS. 10-16—Testing of mmW IC RF Performance

As demand for ICs with integrated antenna arrays grows, improvements in the cost of producing and testing such ICs are desired. Testing of mmW ICs, e.g., according to conventional techniques, may be challenging for various reasons. There may be no physical (e.g., wired) connections such as coax, waveguide or pins with which to connect the antennas to test equipment. However, power and control connections may be made using conventional, e.g., wired methods. Therefore, the radio frequency (RF) performance (e.g., mmW transmission and reception) must be tested over-the-air. Anechoic chambers may be a common technique to avoid interference, e.g., due to reflected signals and multipath effects that can complicate test measurements. However, in order to avoid RF coupling (e.g., interference of the testing equipment with the performance of the antenna array), the testing equipment may require significant space. Further, beamforming requirements may lead to many antennas on a package or on a chip and it may be desired to test the beamforming directional capabilities of the antenna array/IC. Testing of the beamforming capabilities may be expensive, time-consuming, or difficult, e.g., to take measurements from a potentially large number of positions, e.g., because the RF performance may vary spatially. In other words, in order to test the spatial RF performance, measurements must be taken in many positions (e.g., in 3 dimensions, e.g., as a function of x, y, and z position). Such detailed spatial testing may require complex calibration. Still further, a relatively large distance (e.g., away from the antenna array) may be needed to measure a fully formed beam, and small anechoic chambers may not allow measurement in the far field of the array (e.g., where the beam may be fully formed).

Figure 10:
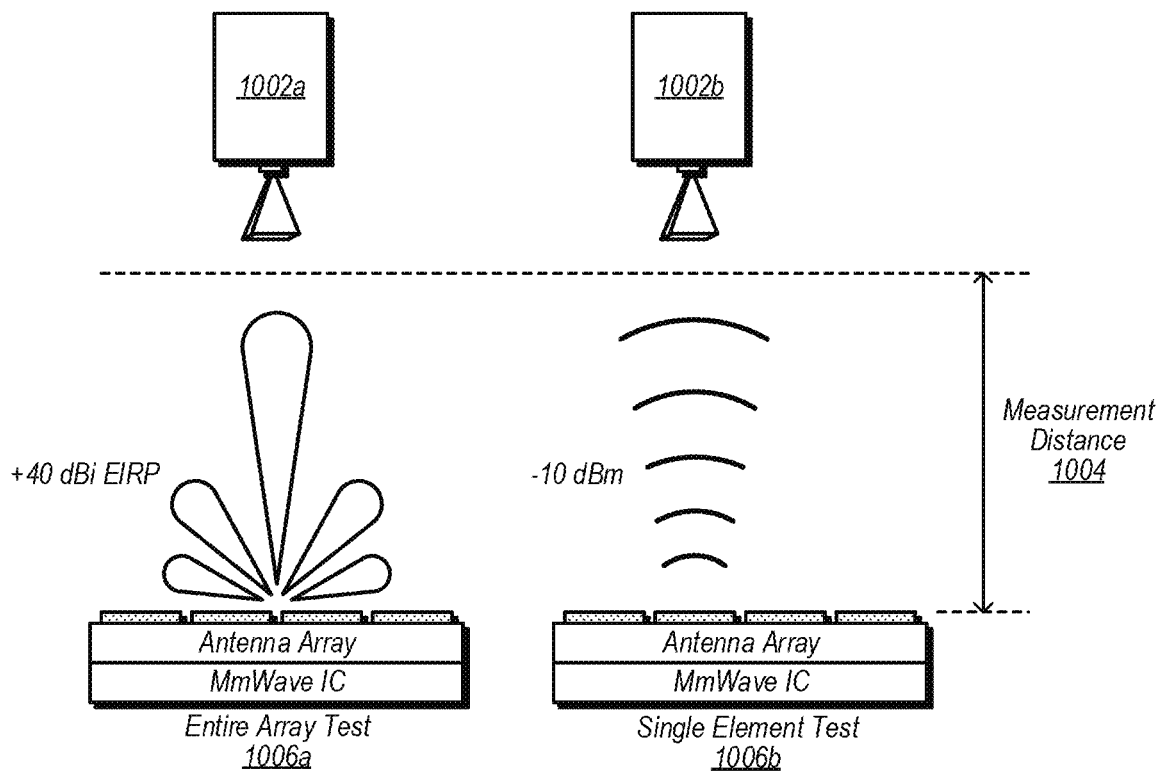
FIGS. 10-16 illustrate aspect of testing millimeter wave integrated circuit radio frequency performance, according to some embodiments.

FIG. 10 illustrates certain aspects of over-the-air testing of RF performance, according to some embodiments. An entire array may be tested, e.g., using an antenna (1002a and 1002b), e.g., a horn antenna as illustrated or other type of antenna (e.g., patch, dipole, loop, directional array, etc.). In order to test the beamforming capability of the array, the antenna (or antennas) may be positioned at a sufficiently large measurement distance (1004) that the beam is fully formed. Further, measurements may be taken from a variety of different positions in order to test the performance of the beam in different directions. An entire array test (1006a) may involve relatively high power signals, e.g., +40 dB (e.g., Equivalent Isotropically Radiated Power (EIRP)), as shown, among various possibilities. Alternatively, single element tests (1006b) may be performed. A single element test may require that the horn antenna be far enough away from the antenna element to be tested to avoid RF coupling. This distance may be smaller than the distance for beam formation, e.g., for an entire array test. A single element test may not test the beamforming performance of the array. Single element tests may involve relatively low power signals, e.g., −10 dB, as shown, among various possibilities.

Figure 11:
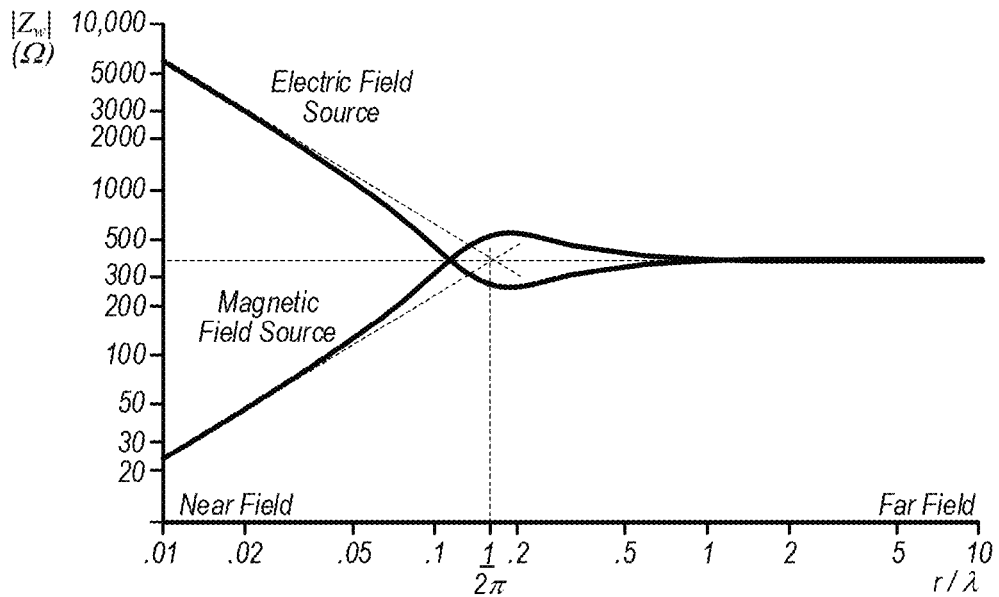

FIG. 11 illustrates fields generated by a short dipole antenna, specifically the wave impedance as a function of distance from the antenna. A "short" dipole may be one where its length is (e.g., much) shorter than ½ wavelength. For the far field, where the distance is greater than the wavelength, the following relations may hold:

E/H=377, for r/λ>1, where E is electric field, H is magnetic field, r is radius, and λ is wavelength;

E and H reduce as 1/r; and

Power drops as $1/r^2$.

For the near field, either the magnetic field or the electric field may dominate. A conductor placed in the near field reactive region may couple electrically or magnetically (e.g., RF coupling) and load down the source driving the antenna. For example, test equipment placed in the near field region may interfere with the operation of the antenna, due to RF coupling.

Figure 12:
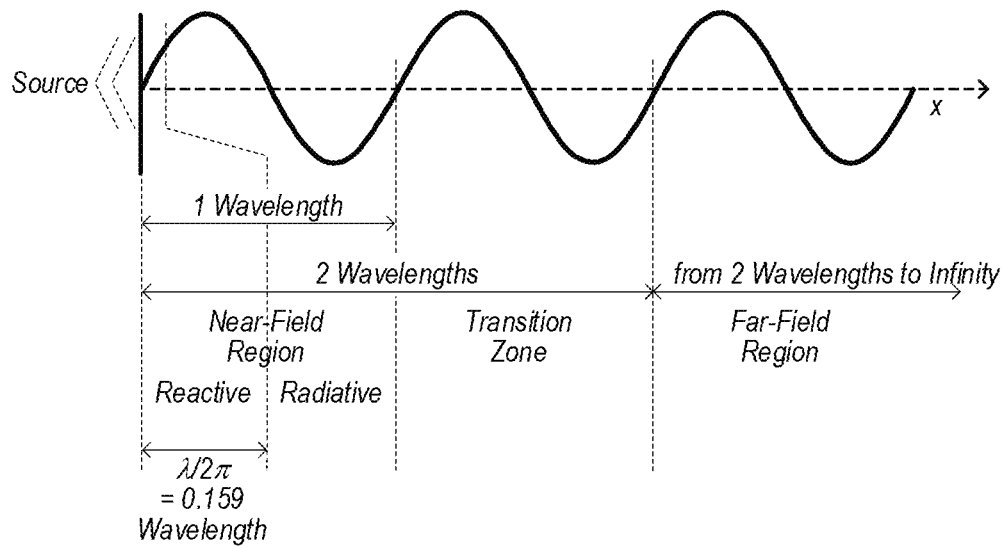

FIG. 12 illustrates fields generated by a short dipole antenna, with further detail of different regions, e.g., as a function of distance from the antenna. In the near-field radiative and transition regions, E and H may reduce as $1/r^n$, where n varies from 1 to 6.

Figure 13:
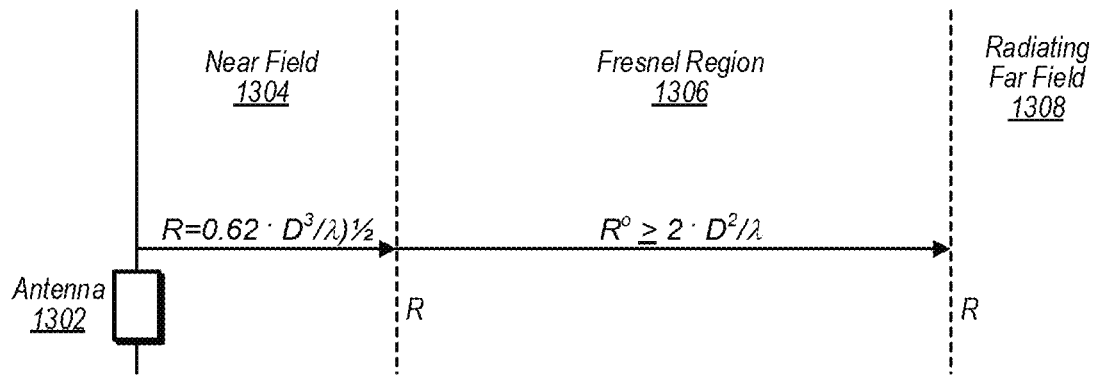

FIG. 13 illustrates radiation zones for antennas larger than half a wavelength, e.g., in contrast to a short dipole antenna. In some embodiments, the length of an individual antenna patch (1302), e.g., as incorporated in an mmW IC, may be approximately equal to half a wavelength. However, an array of such antennas may be (e.g., much) larger than half a wavelength. Therefore, such an antenna array may exhibit characteristics similar to a single antenna larger than half a wavelength, e.g., as illustrated. The near field (e.g., reactive) region (1304) may be defined as:

$$r \le 0.62\sqrt{\frac{D^3}{\lambda}},$$

where D is the length of the antenna. Conductors in this region may load down the antenna and significantly change the radiation pattern.

The Fresnel (or transition) region (1306) may be defined as:

$$r < 0.62\sqrt{\frac{D^3}{\lambda}} < r \le 2\frac{D^2}{\lambda}$$

The radiation pattern may not be fully formed in this region. Conductors in this region may not significantly change the radiation pattern.

The radiating far field region may be defined as:

$$r > 2\frac{D^2}{\lambda}$$

The radiation pattern (1308) may be fully formed in this region.

Figure 14:
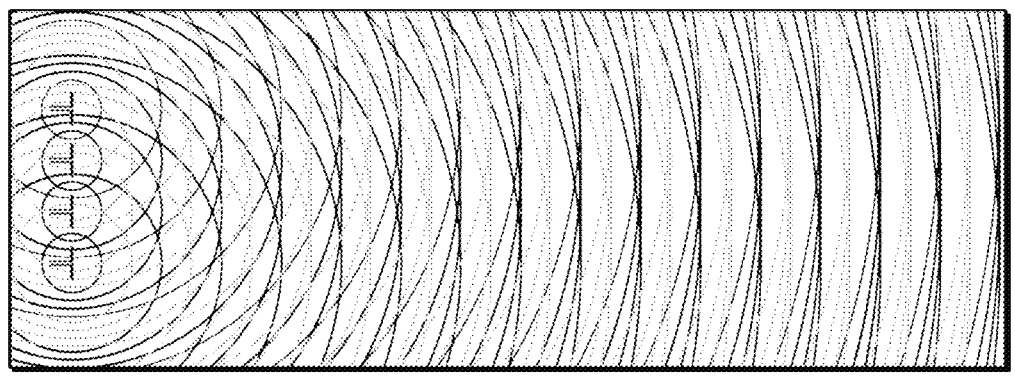

FIG. 14 illustrates the radiation pattern of an exemplary array of 4 antenna elements. Note that the radiation pattern is not fully formed close to the antennas, and becomes clearer (e.g., more fully formed) at increasing distance.

Figure 15:
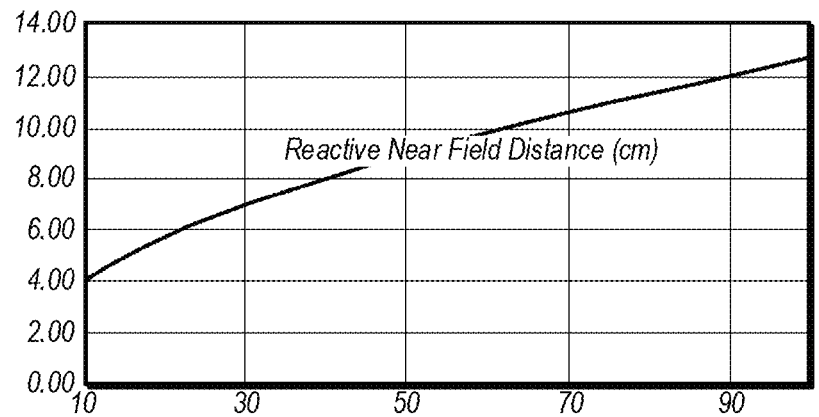
Figure 16:
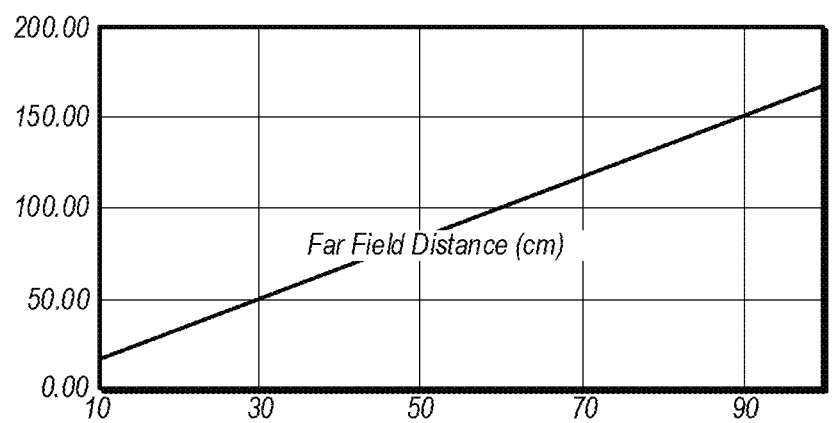

FIGS. 15 and 16 illustrate the boundary of a near field and far field regions (e.g., respectively) for a 5 cm (e.g., square) antenna array as a function of frequency (in GHz). Receiving antennas (e.g., such as testing equipment) may significantly affect the pattern when placed in the reactive near field, e.g., due to RF coupling, e.g., reactive (capacitive or magnetic) coupling. Receiving antennas may not significantly affect the pattern when placed in far field, e.g., because power in the far field is radiated into space. The pattern may not be fully formed in between the near field boundary and the far field boundary (e.g., in the transition zone or Fresnel region, e.g., at distances greater than the near field boundary of FIG. 15 but less than the far field boundary of FIG. 16), but it may not be significantly affected by a receiving antenna. The transition zone may be the far field for each element. However, the (e.g., combined) beam may not be fully formed in this range, e.g., the beam pattern may be different from near field or far field beam patterns.

For example, consider a 30 GHz transmission, e.g., which may be common in a 5G communication system. As shown in FIG. 15, the near field region may end at approximately 7 cm away from the antenna array. The far field region may begin at approximately 50 cm away from the antenna array. Therefore, for the exemplary case of a 30 GHz transmission associated with a 5 cm array, the transition zone may be the zone between 7 and 50 cm from the antenna array. It is noted that other array sizes and frequencies are possible, that the techniques and systems disclosed herein may be applied to other sizes and frequencies as desired, and that the zone boundaries may vary, e.g., based on size and frequency.

Figure 17:
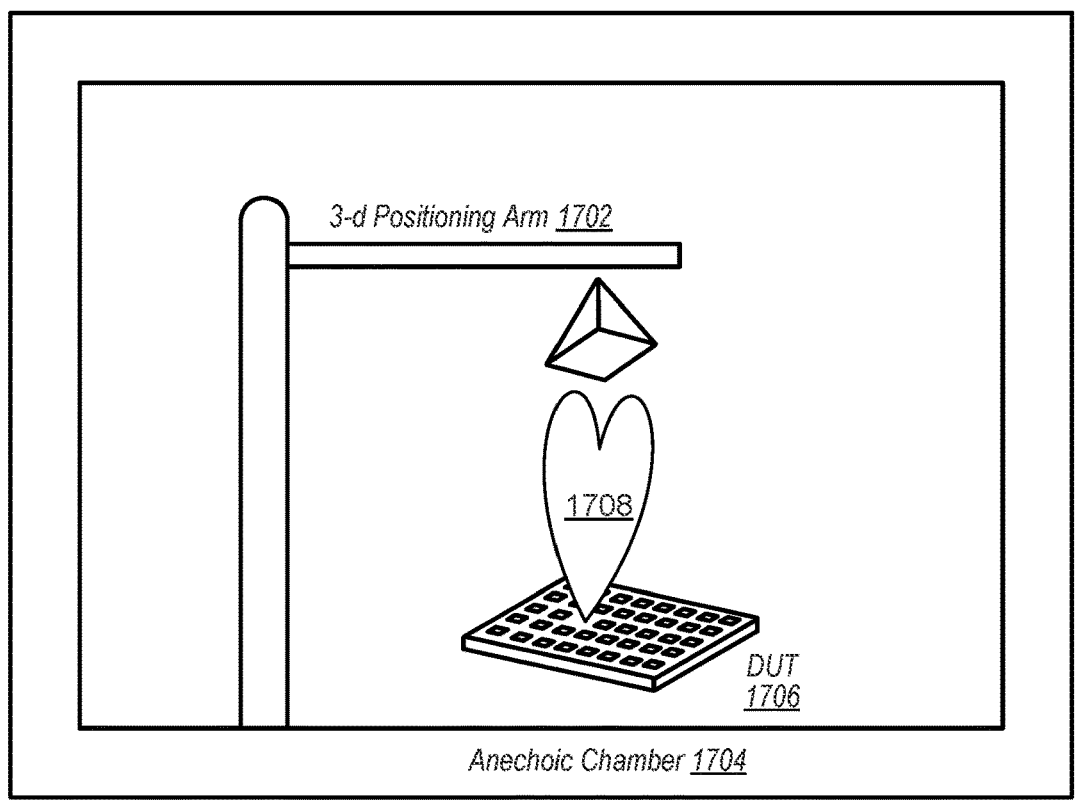
FIGS. 17-20 illustrate various testing approaches, according to some embodiments.
Figure 18:
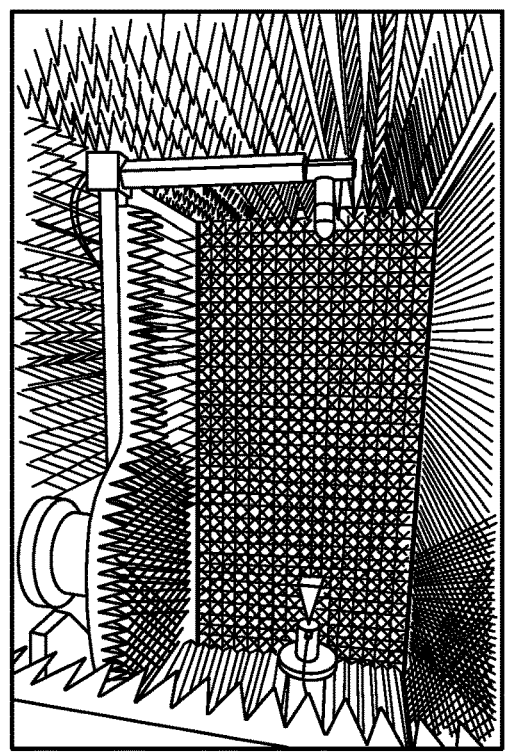
Figure 19:
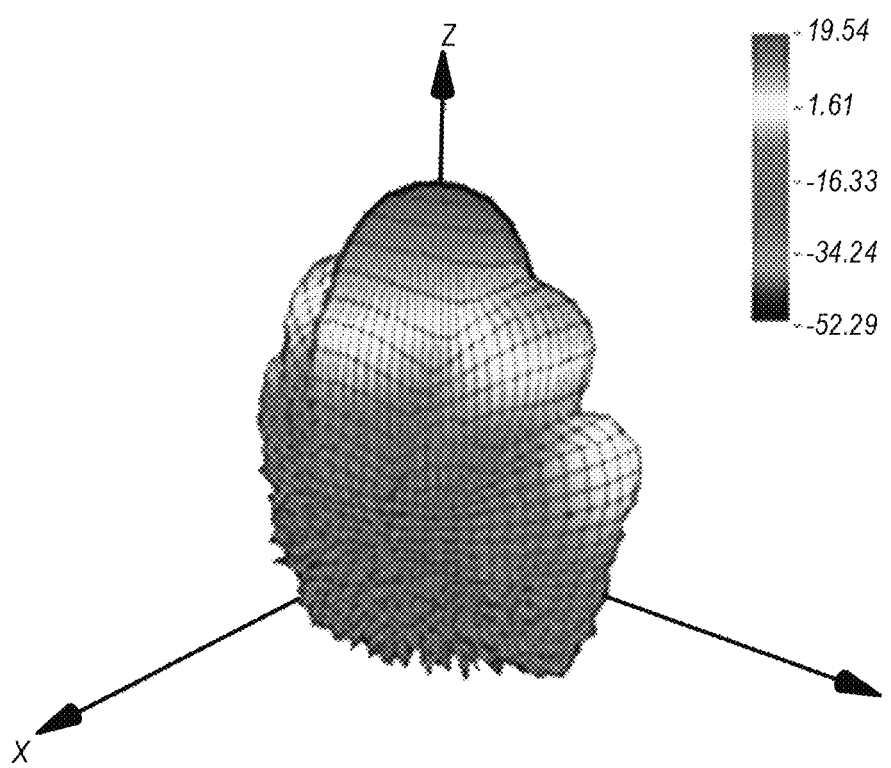

FIGS. 17-19—Testing in the Fresnel Region

In a first group of embodiments, a mmW array of antennas may be tested using a 3-D positioner. Such a 3-D positioner may operate in an anechoic chamber, e.g., sized for 18-87 GHz frequencies, among various possibilities. A 3-D positioning arm may perform spiral scanning, e.g., to take measurements at any number of locations, e.g., using a horn antenna. A low reflection antenna (e.g., a small radar cross section) may be used for testing, e.g., in order to minimize effects on the fields. The measurements may be taken in the near field (e.g., in the Fresnel zone of the near field). Tests may be performed to measure magnitude and phase of the signal/field at any number of locations. The far field pattern may be computed based on the near field measurements. The conversion of near-field to far-field may be accomplished using any appropriate calculation approach. Such calculations may be relatively straight forward if the antenna pattern/configuration is known, or more complex for an arbitrary pattern. Plots of the far field pattern may be generated. Such a 3-D positioning system may be useful for design and characterization tests, however the equipment may be relatively expensive and the tests may be time consuming. First, the testing process itself may take significant time, e.g., because of the need to move the 3-D positioning arm through a large number of positions to test each DUT. Second, the anechoic chamber may need to be large enough to allow for measurements to be taken in enough positions (e.g., in 3-D space) to compute the far field pattern. In some embodiments, the anechoic chamber may be large enough so that measurements may be taken in the radiating far field.

FIG. 17 is a block diagram illustrating a 3-D positioner (1702) in an anechoic chamber (1704), according to some embodiments. As shown, the array (e.g., DUT 1706) may be mounted in the chamber, and may be configured to transmit a signal in a beamforming pattern (e.g., in a tested beam form) (1708). The 3-D positioning arm may move a horn antenna in various positions in the chamber for measurements.

FIG. 18 is an exemplary depiction of a 3-D positioning arm inside an anechoic chamber.

FIG. 19 is an example plot of a field generated by the DUT. Such a plot may be generated based on the tests performed.

Figure 20:
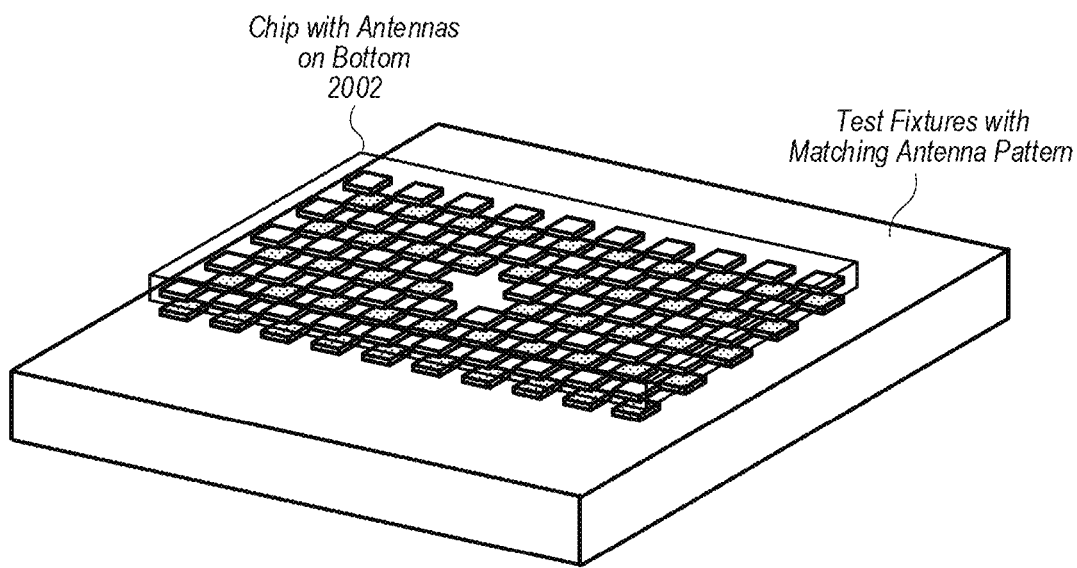

FIG. 20—Testing in the Near Field Region

In a second group of embodiments, rather than performing testing in the Fresnel region of the near field as in the first group of embodiments, testing may be performed in the reactive near field (e.g., in near field 1304 as depicted in FIG. 13). For example, each antenna may be measured separately, e.g., by matching the DUT antenna elements to an array of antenna elements in the test fixtures.

FIG. 20 illustrates such an exemplary testing approach. As shown, the chip with an array of antennas may be positioned close to (e.g., in the reactive near field, e.g., potentially touching) a matching array of test fixtures. This approach may allow each antenna to be measured individually, e.g., the antenna drive (e.g., magnitude and timing of power) may be determined. Relative to the embodiment discussed above, this embodiment may not require bulky testing equipment, e.g., a large anechoic chamber nor testing among a wide variety of spatial positions with such a large anechoic chamber. However, the reactive coupling in the near field may change the loading of each antenna as well as the magnitude and phase of the response of each antenna. Further, the array of test fixtures, may be specifically created to match each different DUT (e.g., or type of DUT), and may therefore result in a costly and time-consuming test process.

FIGS. 21-24—Antenna Array Production Testing

In a third group of embodiments, an array of testing antennas may be positioned in a measurement fixture. In some embodiments, the measurement fixture may be or include a compact anechoic chamber. In some embodiments, the measurement fixture may be or include a socket. The measurement fixture may provide an interface that includes connections (e.g., wired connections which may be easily attached/detached) for power, control, and input/output signals to a device under test (DUT). The interface may also position the DUT in three dimensional space relative to the testing antennas, e.g., in order to perform over-the-air testing of the wireless capabilities/performance of the DUT. The testing antennas may be positioned at various distances from the device under test, e.g., in the Fresnel region of the near field, the reactive near field, or the far field, among various possibilities.

In some embodiments, each antenna of the array of testing antennas may be connected to a diode power detector, and the voltages of each antenna may be measured. As explained further below, such embodiments may be well suited to production testing (e.g., rapid screening) of RF capabilities of ICs. DUTs may be tested for transmission (Tx) and reception (Rx) functionality, including antenna pattern testing, e.g., beamforming. To test Tx, the DUT may be configured to transmit a signal and the resulting signal may be received by the array of testing antennas and measured and/or analyzed by the system. Antenna pattern testing may be a type of Tx testing where the spatial variation of a beamformed Tx signal is tested. Conversely, to test Rx, the DUT may be configured to receive a signal transmitted by one or more of the testing antennas, and the received signal may be measured and analyzed by the system.

This third group of embodiments may offer several advantages, e.g., relative to the first and second group. These advantages may include: 1) positioning an anechoic chamber within a BATS, thus allowing for simultaneous testing of RF capabilities and other features (e.g., power, data connections, etc.) of the DUT. 2) positioning an array of testing antennas inside of a measurement fixture for means of testing a beam pattern. 3) the antenna array may be placed in a fixed location, e.g., to allow for rapid evaluation/screening of DUTs. 4) the antenna array may be mounted in/on a movable actuator. For example, the array elements may be positioned on the X-Y plane. The actuator may move the entire array in the Z-direction. This may be useful for 3-D mapping of the antenna pattern. 5) Diode detectors may be connected to each antenna in the test antenna array to turn the measurement of field strength into a number of DC measurements. 6) A field pattern signature may be used to do production testing or screening of mmW ICs or other devices. 7) Far-field beam patterns may be computed from measurements of the DC voltages from the diode power detectors.

Figure 21:
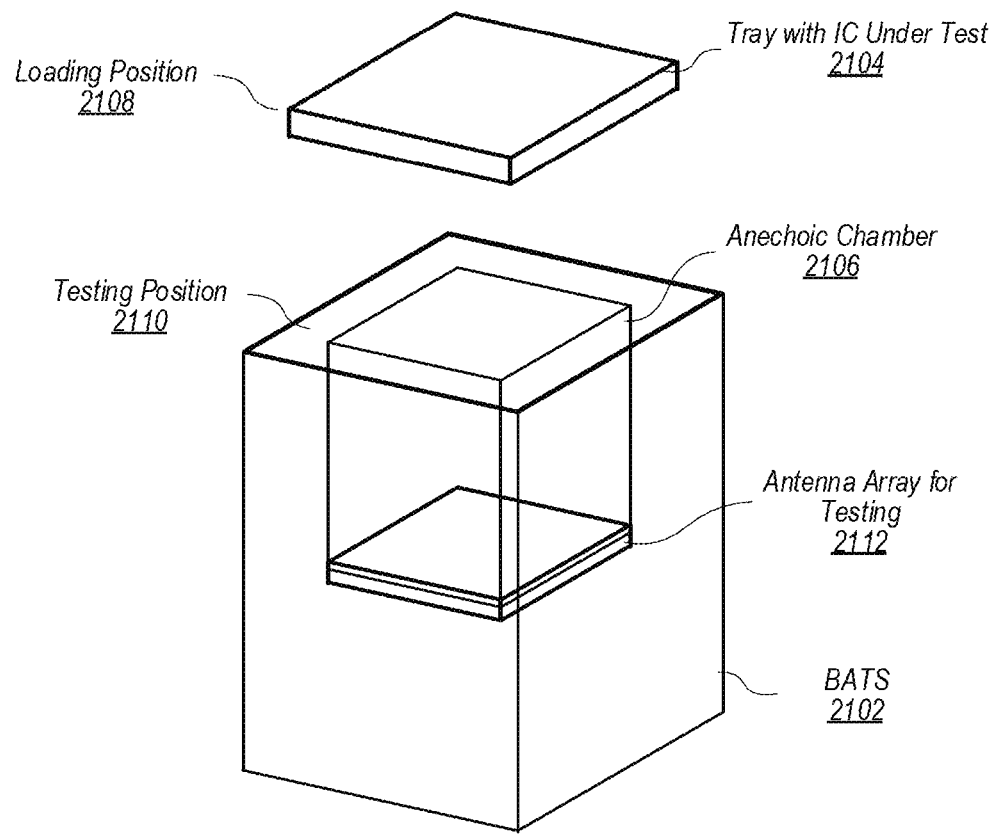
FIGS. 21-24 illustrate various aspects of methods and systems for production testing of millimeter wave integrated circuits and other devices, according to some embodiments.

FIG. 21 illustrates an exemplary system configured for testing of DUT antenna arrays, e.g., according to at least some of the third group of embodiments. It is noted that the system of FIG. 21 is merely one example of a possible system, and that features of this disclosure may be implemented in any of various systems, as desired. In various embodiments, some of the elements shown may be configured, connected, or adjusted in a different position than shown, may be substituted for by other elements, or may be omitted. Additional elements may also be included as desired. As shown, the system may operate as follows.

As shown, the system may include a Built-in Antenna Test System (BATS) 2102 such as a semiconductor test system (STS) 2102. A BATS may be a system to test any of various forms of devices that include antennas, e.g., mmW ICs. The BATS may be configured to perform over the air testing of one or more DUTs. The BATS may also be configured to perform other types of testing, e.g., of power, control, and/or data connections of the DUT, etc.

One or more DUTs to be tested may be mounted on a tray (2104). The tray may allow for simple, rapid installation of the DUT(s). For example, power, data, and control connections may be available, e.g., via an interface board and/or standard mating connectors (e.g., DSUB, VHDCI, etc.). The connections may be standard, customized and/or configurable. The connections may provide for input and/or output signals. The interface may be fixed or may be adjustable, e.g., the interface may provide for fixed or configurable positioning. The tray may mount on one side (e.g., to the top of, in the illustrated example; other positions are possible, including measurement fixtures of other shapes, e.g., spherical) of a measurement fixture. In the illustrated embodiment, the measurement fixture is an anechoic chamber (2106). The tray may be configured to be loaded in a loading position (2108) (as illustrated in the diagram) and to easily fit on to (e.g., or into) the measurement fixture, e.g., the tray may be attached to a "lid" of the measurement fixture which may simply be closed, e.g., to place the DUT(s) into testing position (2110). For example, the tray may be attached via a hinge mechanism.

One or more other sides/regions of the measurement fixture may include an antenna array for testing (e.g., testing antennas) (2112). The array of testing antennas may be positioned at a distance (e.g., or range of distances) away from the DUT that is within the Fresnel region/transition zone, e.g., for the size of DUT antenna array and frequency or range of frequencies to be tested. In some embodiments, the array of testing antennas may be configured to be stationary at a fixed position or distance from the DUT. In other embodiments, the array of testing antennas may be moved. For example, in the illustrated example, the testing antenna array may be vertically adjusted, e.g., in order to allow measurements at different distances from the DUT. For example, the position may be adjusted within the range of the transition zone.

In some embodiments, multiple arrays of testing antennas may be included. For example, one or more antenna arrays may cover multiple surfaces of the measurement fixture. Similarly, antenna arrays may be positioned at different distances from the DUT.

In some embodiments, the measurement fixture may include any of various other elements. For example, the measurement fixture may include any number of sensors or probes associated with any number of measurement devices, and/or may include entire measurement devices. The measurement fixture may include any number of antennas of any type. For example, the fixture may include relatively simple antenna patches or probes and/or may include directional antennas (e.g., highly directional antennas) or other types of antennas.

Figure 22:
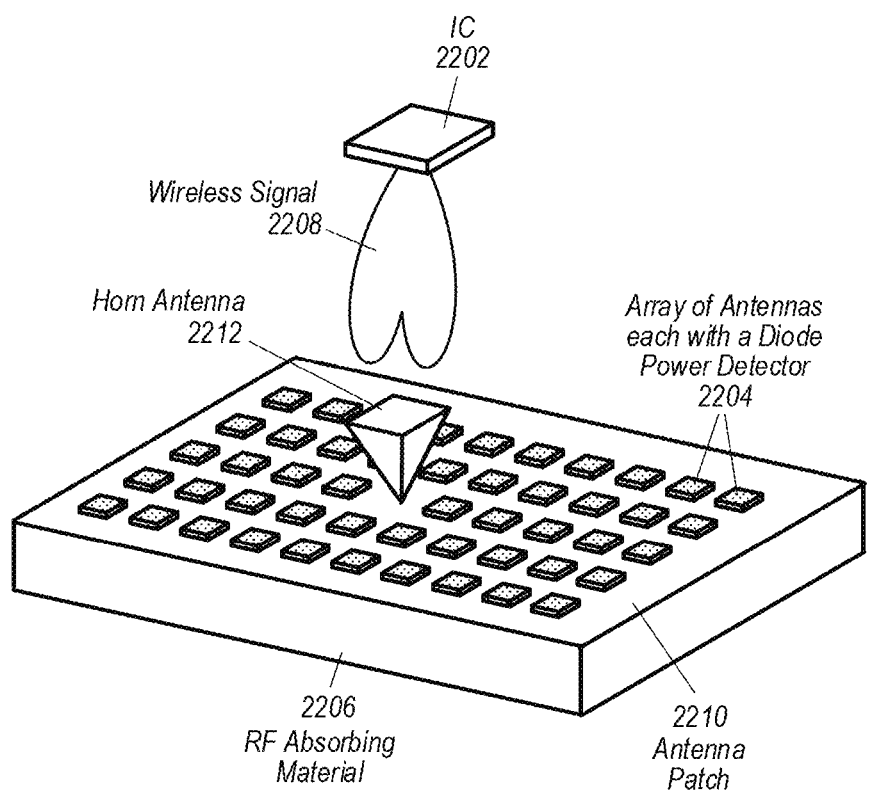

FIG. 22 illustrates further detail of the system of FIG. 21. As shown, the DUT (2202) (e.g., an mmW IC) may be mounted opposite an array of testing antennas (2204), e.g., inside of the measurement fixture (not shown). The testing antennas may be mounted on an RF absorbing material (2206). The testing antennas in the array may be in a constant position relative to each other, e.g., the testing antennas may not move relative to each other. For example, the testing antennas may be arrayed in any pattern, such as a grid or radial pattern, among various possibilities. Any combination of types of antennas may be included in the testing array 2204.

In some embodiments, each of the testing antennas may be paired with a diode power detector, e.g., which may translate a wireless signal (2208) transmitted by the DUT and received by the respective testing antenna into a direct current (DC) voltage, e.g., in order to test the Tx functionality of the DUT under test. The DC voltages may be measured, e.g., by a multi-channel source measure unit (SMU), e.g., connected via one or more cables to the diodes. For example, an array of N×N testing antennas may produce $N^2$ DC voltage signals. The system may interpret the voltages in order to determine the strength of the RF signal at the location of each of the testing antennas. The system may calculate the far field RF pattern based on the voltages and may store or display the results, e.g., for analysis or characterization of the DUT.

Additionally, or alternatively, the system may compare the measured pattern of voltages to an expected pattern of voltages, e.g., an expected "field pattern signature" based on calculations of a signal/RF field pattern that would be produced by an ideal or perfect DUT and/or based on measurements of another DUT. Such an ideal pattern or signature may be determined prior to and/or during testing. For example, the signature may be determined based on measurements of one or more previously tested DUTs (e.g., of a known or high quality) and/or based on calculations of a desired field (e.g., that would be produced by a theoretical/hypothetical DUT). The system may make a determination of the quality or performance of the DUT based on a comparison of the measured pattern of voltages to the expected/ideal pattern of voltages. Such a determination may be a relatively quick yes/no or go/no-go comparison. In other words, if the measured pattern of voltages is within a tolerance band of the ideal/expected quality, the DUT may be determined to be of sufficient quality. Conversely, an DUT associated with a measured pattern of voltages outside of the tolerance band may be determined to not meet a quality standard, and may be rejected, repaired, or studied further.

Such a tolerance band may be based on comparing one or more of the measurements to one or more thresholds. One example of measured values may be voltages measured by one or multiple testing antenna(s), e.g., and associated diodes. For example, some or all measurements may be compared to one or more thresholds. Thresholds may be applied to individual, average/mean, median, percentile, standard deviation, or other values. For example, an DUT may be rejected (e.g., fail a production test) if a single measured value (e.g., or other number of measured values) is different from the ideal value(s) by more than a certain threshold. In other words, if the DC voltage measured by a single antenna patch differs from an expected voltage for that antenna patch by more than a threshold value, the DUT may be rejected. The threshold may be specific to each antenna/point, a group of points, or may be generalized. For example, each individual point may have an associated individual threshold or all points may share a single threshold, or any number of groups of points may be associated with threshold values, etc.

Additionally or alternatively, an DUT may be rejected if the average value of the measured points is different (e.g., by at least a threshold amount) from the expected average value. For example, an average value of the absolute value of the difference between multiple respective measured values and associated respective expected values may be compared to a threshold.

In some embodiments, an DUT may be rejected if the variance (e.g., or standard deviation, etc.) of the difference between measurements and ideal values is higher than a threshold. As another possibility, an DUT may be rejected if a threshold fraction of values (e.g., for the DUT overall, or in one or more sub-regions or sub-portions of the DUT) differ from ideal values by more than a threshold. Other comparisons are possible according to some embodiments.

In some embodiments, some or all of the test antennas in the test antenna array may be relatively simple and cheap antenna patches (e.g., antenna patch 2210). However, one or more other antennas (e.g., horn, dipole, loop, or a directional array antennas) may be included in the array of testing antennas (2212). For example, horn antenna(s) (and/or antennas of other types) may be used for Rx or Tx measurements, e.g., including parametric measurements requiring a vector signal analyzer (VSA), a vector signal generator (VSG), or a vector signal transceiver (VST), or other test equipment. For example, the horn antenna may be used to transmit a test signal(s), e.g., using a VST, to the DUT under test, and the ability of the DUT to receive the test signal may be tested (e.g., using a data connection of the BATS). The results may be stored and/or displayed for characterization of the DUT. Additionally, or alternatively, the actual received signal may be compared to an expected signal/result (e.g., using one or more thresholds) and a determination may be made to reject (or not) the DUT based on the comparison. Further, in some embodiments, the other antennas (e.g., patch antennas) may also be used for Rx measurements, e.g., to transmit signals for the DUT to receive.

In some embodiments, the system may include more than one measurement fixture, e.g., allowing for testing of one or more DUTs in a first chamber while other DUTs are being exchanged for a testing in a different chamber. For example, an DUT may be tested through a plurality of chambers, e.g. in series. Additionally, each chamber may be used at the same time for respective DUTs, e.g., allowing for testing through the chambers in a pipelined and/or automated fashion.

In some embodiments, additional equipment may be included in the system. For example, fan cooling may be provided, additional instruments may be included (e.g., to test other features of the DUT), etc.

Figure 23:
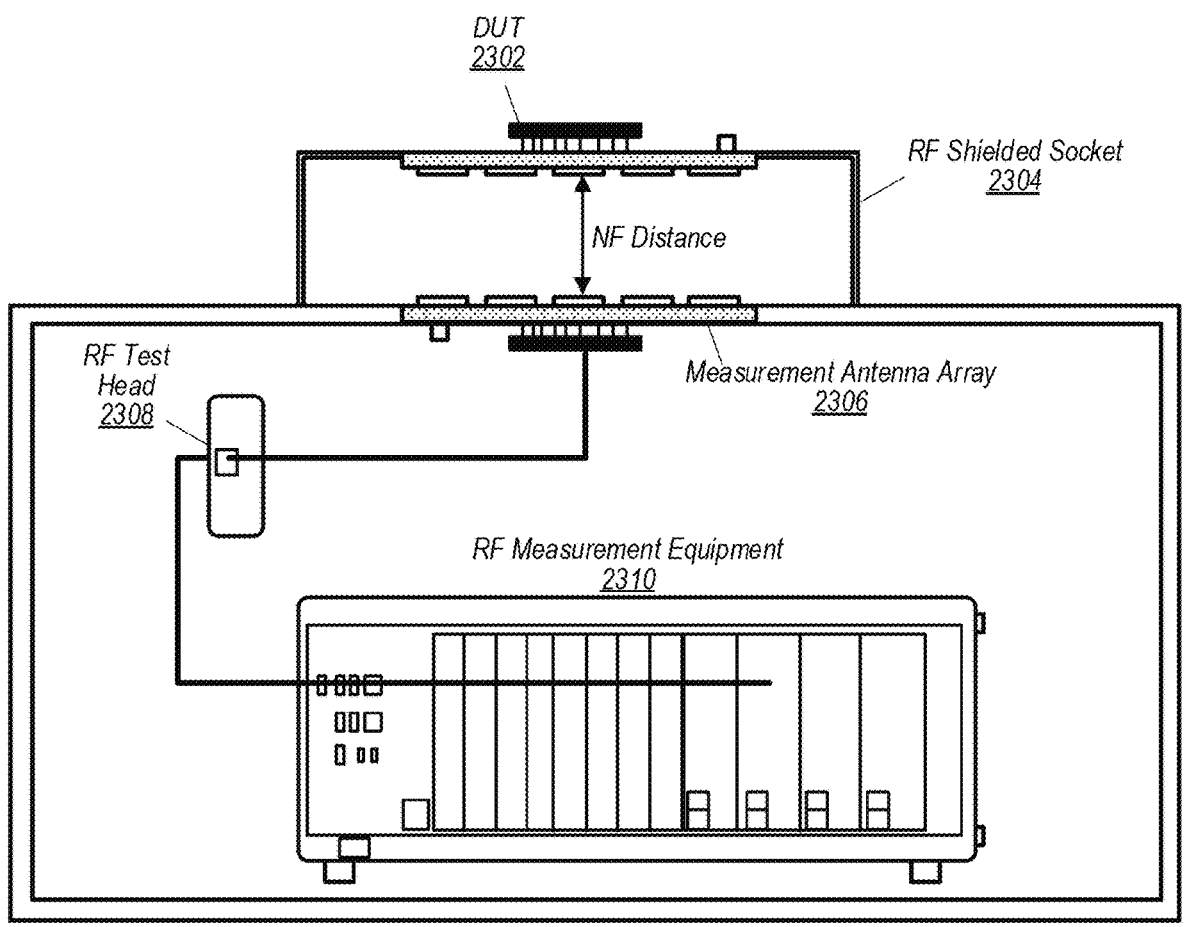

FIG. 23 illustrates a DUT 2302 attached via a RF shielded socket 2304. As shown, the socket 2304 may position the DUT at a distance (e.g., in the near field or NF distance) from a measurement antenna array 2306 (multiple arrays may be included). The distance between the DUT and the measurement antenna array may be fixed or may be adjustable. Further, the relative positions may be adjusted in other ways, e.g., changing angles or alignment between the DUT and antenna array. For example, the DUT may be offset laterally relative to one or more measurement arrays.

The socket may serve as an interface to provide power, data, and control connection to the DUT. The socket may also shield the DUT and/or measurement antenna array from interference. The socket may further include RF absorbing materials or otherwise be configured to reduce RF reflections of transmissions between the DUT and the measurement antenna array.

The measurement antenna array may be connected through an RF test head 2308 to one or more RF instruments, e.g., RF measurement equipment 2310. The RF test head and the measurement equipment may perform various measurements of signals received by the measurement antenna array. For example, the RF test head and the measurement equipment may perform DC voltage measurements. Further, the RF test head and the measurement equipment may (additionally or alternatively) perform any combination of phase, modulation, power, frequency, and/or spectrum measurements.

Method for Performing Production Testing

Figure 24:
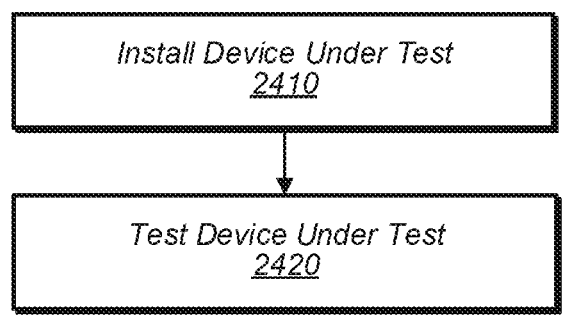

FIG. 24 is a simplified block diagram, illustrating an exemplary method for performing production testing of devices with built in antennas, e.g., mmW ICs. It is noted that the method of FIG. 24 is merely one example of a possible method, and that features of this disclosure may be implemented in any of various methods, as desired. Aspects of the method of FIG. 24 may be implemented by a system, such as illustrated in and described with respect to the Figures, among other systems and devices, as desired. For example, the method of FIG. 24 may be implemented by a systems and devices such as shown in FIGS. 21-23, among various possibilities. In various embodiments, some of the elements of the methods shown may be performed concurrently, in a different order than shown, may be substituted for by other method elements, or may be omitted. Additional method elements may also be performed as desired. As shown, the method may operate as follows.

One or more DUTs (e.g., mmW ICs, among various possibilities) may be installed in testing position(s) (2410). A first DUT may be connected (e.g., physically, e.g., with standard wire or cable connector(s)) for power, data and/or control. The power and control connection may be configured to drive the antennas of the DUT for Tx testing and/or to receive signals received by the DUT for Rx testing. The DUT may be attached to a tray, which may be fit into a first measurement fixture.

The system may perform testing of the DUT (2420). The testing may include over-the-air Tx, Rx, and/or VST tests of the DUT. Tx testing may include determining whether (e.g., the extent to which) the DUT accurately reproduces an intended signal as an RF signal, e.g., at the correct power, timing, etc. In other words, the testing may include causing the DUT to transmit a signal based on a test input and measuring a wireless signal transmitted by the DUT. The measurements of the wireless signal may be compared to one or more expected measurements and differences of the measurements in comparison to the expected measurements may be determined.

Rx testing may include determining whether (e.g., the extent to which) the DUT has appropriate sensitivity and accurately reproduces a received RF signal as an output signal, e.g., over a wired connection. VST testing may determine the directional/beamforming capability of the DUT, e.g., as a transmitter, receiver, or both.

The over-the-air (OTA) testing may include performing measurements with an array of testing antennas in the Fresnel zone (e.g., relative to the DUT). The observed patterns from measurements (e.g., DC voltage measurements) in the Fresnel zone may be used to compute a far field beam pattern. The computed far field characterization may be used for characterization of the DUT, among various possibilities. The observed patterns from measurements in the Fresnel zone may be compared to an (e.g., previously stored or computed) expected signature/pattern (e.g., for the DUT, or based on an DUT similar to the tested DUT). Such a comparison (or comparisons) may be used for a production test, e.g., to rapidly determine whether the DUT meets one or more performance standards. Alternatively, or additionally, the computed far field characterization may be compared to a calculated or previously tested model DUT's far field testing results. A comparison may use any number of thresholds and/or any statistical techniques.

In some embodiments, the OTA testing may performed in the near and/or far field regions.

In some embodiments, the testing may be performed automatically, e.g., in response to placement of the DUT in the system and connection to the power/control connections.

In some embodiments, the testing may further include testing of the power and data connections (e.g., simultaneously or sequentially with the over-the-air testing of the RF functions) of the DUT.

In some embodiments, the testing may further include a determination of the quality of the DUT. For example, the DUT may be scored on one or more metrics (e.g., RF transmission, RF reception, beamforming, data connection, power connection, etc.). Additionally, or alternatively, the system may determine whether or not the DUT passes one or more quality criteria (e.g., based on comparison of a measured pattern of DC voltages to an expected signature pattern, etc.). Such a test may be a binary (e.g., pass/no-pass) screening test, e.g., as may be useful for rapid screening of (e.g., large numbers of) DUTs.

In some embodiments, multiple DUTs may be tested. For example, multiple DUTs may be installed in testing positions, and may be concurrently or sequentially tested. Different field pattern signatures may be used for DUTs in different testing positions. Similarly, the method may include causing multiple DUTs to be sequentially installed in testing positions and tested, e.g., automatically.

In some embodiments, the DUT's wireless capabilities may be tested for phase, power, spectrum, frequency, and/or modulation. Such capabilities may be tested in transmission and/or reception.

In the following, exemplary embodiments are provided.

In one set of embodiments, a semiconductor test system (STS) may comprise: a processing element; an anechoic chamber; a fixed conductive interface, wherein the fixed conductive interface is configured to position a device under test (DUT) inside the anechoic chamber, wherein the fixed conductive interface provides power and data connections to the DUT; and an array of antennas, wherein the array of antennas is inside the anechoic chamber, wherein the array of antennas is configured to test radio frequency (RF) characteristics of the DUT.

In some embodiments, the array of antennas may be in a fixed location, wherein the fixed location is within the Fresnel region.

In some embodiments, the location of the array of antennas may be adjustable.

In some embodiments, each respective antenna of the array of antennas may be connected to a respective diode detector, wherein each diode detector converts a measurement of field strength to a respective direct current (DC) voltage measurement.

In some embodiments, the STS may be configured to compare the DC voltage measurements to a field pattern signature, wherein the comparison is useable for production testing or screening of the DUT.

In some embodiments, the STS may be configured to compute a far field beam pattern, wherein the far-field beam pattern is based on the DC voltage measurements.

A further exemplary set of embodiments may include a non-transitory computer accessible memory medium comprising program instructions which, when executed at a device, cause the device to implement any or all parts of any of the preceding examples.

A still further exemplary set of embodiments may include a computer program comprising instructions for performing any or all parts of any of the preceding examples.

Yet another exemplary set of embodiments may include an apparatus comprising means for performing any or all of the elements of any of the preceding examples.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. An apparatus for testing a device under test (DUT), the apparatus comprising:
a processing element configured to:
receive a plurality of direct current (DC) voltage measurements from an antenna array, wherein the antenna array is positioned in a measurement fixture and within a transition zone between a near field boundary and a far field boundary with respect to the DUT, wherein the plurality of DC voltage measurements are based on a beamformed test signal transmitted by the DUT;
compare the plurality of DC voltage measurements to a plurality of expected measurements; and
determine whether to reject the DUT based at least in part on the comparison.

2. The apparatus of claim 1, wherein the plurality of expected measurements is based on a pattern of measurements of a model DUT of a known quality.

3. The apparatus of claim 1, wherein the processing element is further configured to:
cause a test signal to be transmitted to the DUT;
receive at least a first signal from the DUT, wherein the first signal is based on the test signal; and
compare the first signal to an expected signal, wherein the determination of whether to reject the DUT is further based at least in part on the comparison of the first signal to the expected signal.

4. The apparatus of claim 3, wherein the processing element is further configured to test a power connection of the DUT.

5. The apparatus of claim 1, wherein the comparison comprises calculating respective differences between respective DC voltage measurements of the plurality of DC voltage measurements and respective expected measurements of the plurality of expected measurements and comparing the respective differences to a first threshold.

6. The apparatus of claim 5, wherein the comparison further comprises:
determining a number of the respective differences that exceed the first threshold; and
determining that the number is less than a second threshold.

7. The apparatus of claim 6, wherein the comparison further comprises comparing the respective differences to a third threshold, wherein if the at least one of the respective differences exceeds the third threshold, the determination is to reject the DUT.

8. A method for performing testing of a device under test (DUT), the method comprising:
- installing the DUT in a testing position, wherein the testing position is in a measurement fixture and so that an array of antennas is within a transition zone between a near field boundary and a far field boundary with respect to the DUT;
- attaching the DUT to a wired connection;
- causing the DUT to transmit a beamformed wireless signal based on a test input;
- measuring the beamformed wireless signal using an array of antennas connected to diodes, wherein the diodes are configured generate direct current (DC) voltages based on the beamformed wireless signal;
- compare the DC voltages to a plurality of expected voltages; and
- determine, based at least in part on the comparison, whether to reject the DUT.

9. The method of claim 8, the method further comprising:
- performing receive testing of the DUT, wherein the determination is further based at least in part on the receive testing.

10. The method of claim 8, the method further comprising:
- testing at least one of:
  - phase;
  - modulation; and
  - spectrum, wherein the determination is further based at least in part on the testing.

11. The method of claim 8, wherein the plurality of expected voltages is based on a model DUT of a known quality.

12. The method of claim 8, wherein the DUT is rejected if a difference between a first DC voltage of the DC voltages and a corresponding first voltage of the plurality of expected voltages exceeds a first threshold.

13. The method of claim 8, wherein the DUT is rejected if respective differences between respective DC voltages of the DC voltages and corresponding respective voltages of the plurality of expected voltages exceeds a second threshold for a threshold fraction of the DC voltages.

14. A system for testing a device under test (DUT), the system comprising:
- a measurement fixture;
- an antenna array; and
- a processing element operably connected to the antenna array and configured to cause the system to:
- determine a plurality of direct current (DC) voltage measurements from the antenna array, wherein the antenna array is positioned in the measurement fixture and within a transition zone between a near field boundary and a far field boundary with respect to the DUT, wherein the plurality of DC voltage measurements are based on a beamformed test signal transmitted by the DUT; and
- compare the plurality of DC voltage measurements to a plurality of expected measurements.

15. The system of claim 14, wherein the plurality of expected measurements is based on a pattern of measurements of a model DUT.

16. The system of claim 14, wherein the processing element is further configured to cause the system to:
- cause a test signal to be transmitted to the DUT;
- receive at least a first signal from the DUT, wherein the first signal is based on the test signal; and
- compare the first signal to an expected signal.

17. The system of claim 14, wherein the processing element is further configured to cause the system to test a power connection of the DUT.

18. The system of claim 14, wherein the comparison comprises calculating respective differences between respective DC voltage measurements of the plurality of DC voltage measurements and respective expected measurements of the plurality of expected measurements and comparing the respective differences to a first threshold.

19. The system of claim 18, wherein the comparison further comprises:
- determining a number of the respective differences that exceed the first threshold; and
- determining that the number is less than a second threshold.

20. The system of claim 19, wherein the comparison further comprises comparing the respective differences to a third threshold.

* * * * *